United States Patent [19]
Jang

[11] Patent Number: 5,926,043
[45] Date of Patent: Jul. 20, 1999

[54] OUTPUT CIRCUIT FOR A SEMICONDUCTOR DEVICE

[75] Inventor: Seong-Jin Jang, Seoul, Rep. of Korea

[73] Assignee: LG Semicon Co., Ltd., Cheongju, Rep. of Korea

[21] Appl. No.: 08/892,841

[22] Filed: Jul. 11, 1997

Related U.S. Application Data

[30] Foreign Application Priority Data

Jul. 27, 1996 [KR] Rep. of Korea ............. 96 /30784

[51] Int. Cl.⁶ ..................................... H03K 5/153
[52] U.S. Cl. ................... 327/80; 327/81; 327/63; 327/72
[58] Field of Search ............... 327/63, 64, 74–82

[56] References Cited

U.S. PATENT DOCUMENTS

| | | | |
|---|---|---|---|
| 3,675,238 | 7/1972 | Butscher | 340/347 SY |
| 4,183,016 | 1/1980 | Sawagata | 340/347 AD |
| 4,498,040 | 2/1985 | Tatsushi | 327/63 |
| 5,254,883 | 10/1993 | Horowitz et al. | 326/30 |
| 5,305,282 | 4/1994 | Choi | 365/230.08 |
| 5,402,063 | 3/1995 | Kim | 324/158.1 |
| 5,729,172 | 3/1998 | Tsukada | 327/536 |

*Primary Examiner*—Timothy P. Callahan
*Assistant Examiner*—An T. Luu

[57] ABSTRACT

An output circuit for a semiconductor device that outputs an output voltage based on a received external signal. The output circuit has an interface that receives the external signal, and a comparing unit that compares the external signal with a plurality of predetermined threshold voltages. The comparing unit outputs a voltage driving signal based on the comparison results. Also, the output circuit has an output unit that outputs the output voltage based on the voltage driving signal from the comparing unit.

27 Claims, 6 Drawing Sheets

FIG. 4A  POWER
FIG. 4B  A
FIG. 4C  B
FIG. 4D  C
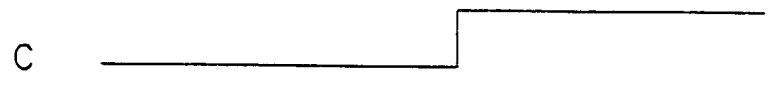
FIG. 5
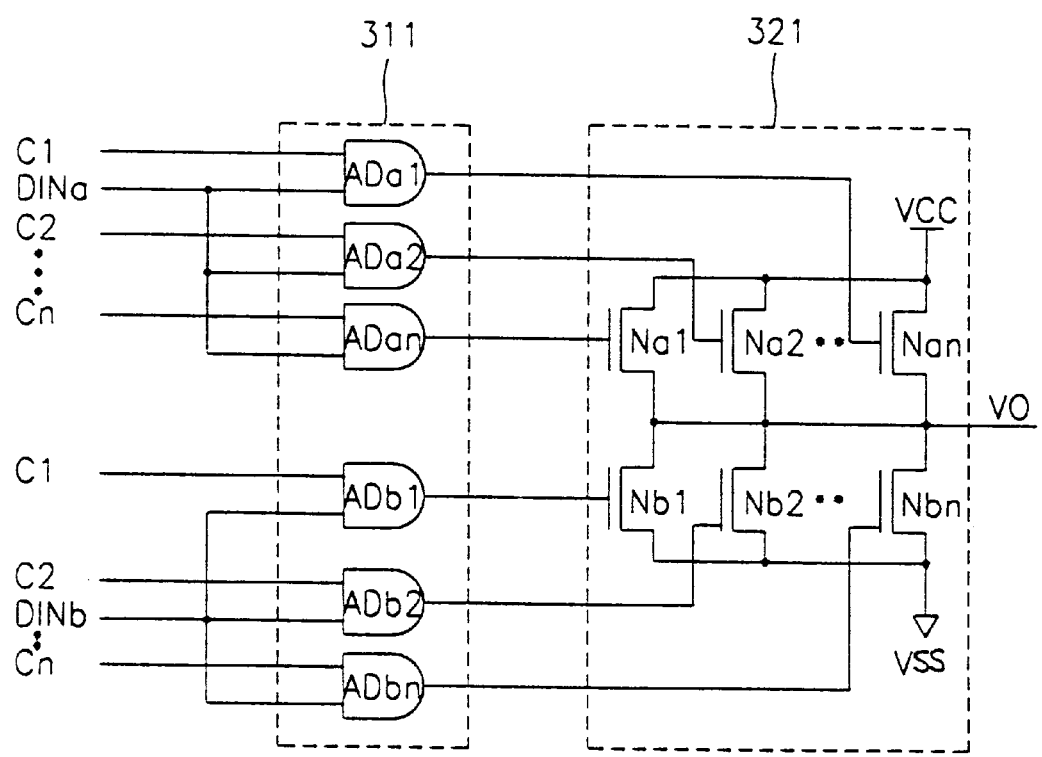

FIG. 7A POWER 
FIG. 7B A 
FIG. 7C B 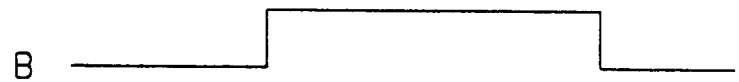
FIG. 7D C 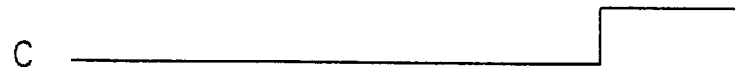
FIG. 7E D 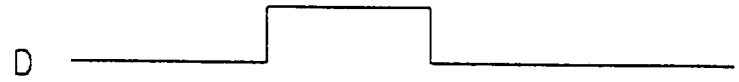
FIG. 7F E 

5,926,043

OUTPUT CIRCUIT FOR A SEMICONDUCTOR DEVICE

BACKGROUND OF THE INVENTION

1. Field of the Invention

The present invention relates to an output circuit for a semiconductor device.

2. Description of the Prior Art

As shown in FIG. 1, a conventional output circuit includes an interface 111, a voltage adjuster 121, a comparator 131, a controller 141, a counter 151, first through fifth data lines 121a–121e, and a latch unit 161. The interface 111 includes an external resister REXT having a termination voltage VTERM applied thereto. The voltage adjustor 121 includes first through fifth NMOS transistors Na through Ne connected in parallel between the interface 11 and the latch unit 161 via the first through fifth data lines 121a–121e. A drain and source of each of the first through fifth NMOS transistors Na through Ne are connected to the external resistor REXT and a ground voltage Vss, respectively. Also, an output voltage signal Vo is transmitted on a common connection between the external resistor REXT and the drains of the first through fifth NMOS transistors Na through Ne.

A positive input terminal (+) of the comparator 131 is connected to the common connection between the external resistor REXT of the interface 111 and the drains of the first through fifth NMOS transistors Na through Ne. A negative input terminal (−) of the comparator 131 receives a reference voltage VREF.

An input of the controller 141 is connected to the output of the comparator 131, and an input of the counter 151 is connected to the output of the controller 141. The counter 151 has first through fifth outputs connected to first through fifth data lines 121a through 121e, respectively. The first through fifth data lines 121a through 121e are connected to the gates of the first through fifth NMOS transistors Na through Ne, respectively, of the voltage adjustor 121. Also, the first through fifth data lines 121a through 121e are connected to first through fifth inputs of the latch unit 161, respectively. The latch unit 161 also has first through fifth outputs outputting a latched value.

Referring to FIG. 1, the operation of the conventional output circuit will now be described in detail.

During an initial operation, the controller 141 sends a control signal to the counter 151 to start an initial count operation. Then, the counter 151 outputs a zero value "00000" on the first through fifth data lines 121a through 121e. Thus, a value "0" signal is applied to the gates of the first through fifth NMOS transistors Na through Ne causing the first through fifth NMOS transistors Na through Ne to be turned "OFF". The relative resistances of the first through fifth NMOS transistors Na through Ne are 1X, 2X, 4X, 8X and 16X, respectively. The value "X" is a turn-on resistance value.

Because the first through fifth NMOS transistors Na through Ne are turned "OFF," no current flows from the external resistor REXT through any of the first through fifth NMOS transistors Na through Ne when a termination voltage VTERM is applied to the external resistor REXT. Thus, the termination voltage VTERM is outputted as the output voltage Vo on the common connection between the external resistor REXT and the drains of the first through fifth NMOS transistors Na through Ne.

For the initial operation, the voltage level relationship between the termination voltage VTERM, the reference voltage VREF, and the output voltage Vo is as follows:

VTERM>VREF>Vo

Therefore, the comparator 131 compares a voltage level of the termination voltage VTERM applied to its positive input terminal (+) with a voltage level of the reference voltage VREF applied to its negative input terminal (−). Since the voltage level of the termination voltage VTERM is larger than the voltage level of the reference voltage VREF, the comparator 131 outputs a positive value (+) to the controller 141. After receiving a positive value (+) from the comparator 131, the controller 141 sends a control signal to the counter 151 indicating the positive value (+). Based on the received control signal, indicating the positive value (+), the counter 151 initiates a count operation, and the count value increases by one (i.e., becomes 00001).

By outputting count value of 00001, the counter 151 outputs 00001 on the first through fifth data lines 121a through 121e, respectively. Thus, "1" on the first data line 121a is applied to the gate of the first NMOS transistor Na, and turns the first NMOS transistor Na "ON." Also, a "0" on the second through fifth data lines 121b through 121e is applied to the gates of the second through fifth NMOS transistors Nb through Ne, and turns the second through fifth NMOS transistors Nb through Ne "OFF."

As the first NMOS transistor Na is turned "ON," current flows through the external resistor REXT of the interface 111 and through the first NMOS transistor Na. This causes the output voltage Vo to change accordingly. Thus, the common connection between the external resistor REXT and the drains of the first through fifth NMOS transistors Na through Ne achieves a new output voltage Vo. The new output voltage Vo is applied to the positive input terminal(+) of the comparator 131. Then the voltage level of the new output voltage Vo is compared with the reference voltage VREF applied to the negative input terminal (−) of the comparator 131.

Based on the comparison result, if the output voltage Vo is still larger than the reference voltage VREF, the comparator 131 again outputs a positive value (+) to the controller 141. Then, the controller 141 outputs the control signal to the counter 151 indicating a positive value (+). The counter 151 counts to the next value of two (i.e., 00010) and outputs 00010 on the first through fifth data lines 121a through 121e, respectively.

Thus, the value of "1" on the second data line 121b is applied to the gate of the second NMOS transistor Nb; thereby turning the second NMOS transistor Nb "ON." In addition, the value of "0" on the first data line 121a and third through fifth data lines 121c through 121e is applied to the gates of the first NMOS transistor Na and the third through fifth NMOS transistors Nc through Ne; thereby turning the first NMOS transistor Na and the third through fifth NMOS transistors "OFF."

Therefore, current flows through the external resistor REXT of the interface 111 and through the second NMOS transistors Nb of the voltage adjustor 121. As a result, the output voltage Vo applied to the positive input terminal (+) of the comparator 131 changes accordingly.

While repeating the above procedure, if the output voltage level Vo becomes smaller than the voltage level of the reference voltage VREF, the comparator 131 will output a negative value (−) to the controller 141. Then, the controller 141 will send a control signal to the counter 151 to stop counting. Thus, the last count value on the first through fifth data lines 121a through 121e will be latched by the latch unit 161. The output of the latch unit 161 will then be used for determining the output voltage.

According to the conventional output circuit, a complicated circuit construction is required that includes the comparator, the counter, and the controller. Also, the conventional output circuit only operates after power is applied and stabilized to the output circuit and a reference voltage VREF is additionally required.

SUMMARY OF THE INVENTION

Accordingly, it is an object of the present invention to provide an output circuit for a semiconductor device which has a simple structure.

A further object of the present invention is to provide an output circuit which automatically adjusts an output voltage based on a comparison of a sensed voltage signal with a plurality of predetermined threshold voltages.

Another object of the present invention to provide an output circuit for a semiconductor device which is capable of automatically adjusts an output voltage simultaneously with power up of the output circuit.

To achieve these and other objects, there is provided a novel and useful output circuit for a semiconductor device which includes an interface receiving an external signal; a voltage driving controller generating a voltage driving signal, the voltage driving controller including, a sensing unit sensing the external signal from the interface and outputting a sensed voltage signal based on the sensed external signal, a transmission gate transferring the sensed voltage signal from the sensing unit in accordance with a first control signal, a delay unit delaying the transferred sensed voltage signal from the transmission gate, a transmitting unit transmitting the delayed sensed voltage signal from the delay unit, and a latching unit latching the transmitted delayed sensed voltage signal and outputting the voltage driving signal; and an output unit outputting an output voltage in accordance with the voltage driving signal from the latching unit.

To achieve these and other objects, there is also provided a novel and useful output circuit for a semiconductor device which includes an interface receiving an external signal; a comparing unit comparing the external signal with a plurality of predetermined threshold voltages and outputting a voltage driving signal based on the comparison result; and an output unit outputting an output voltage in accordance with the voltage driving signal.

To achieve these and other objects, there is still another novel and useful output circuit for a semiconductor device which includes an interface receiving an external signal; a voltage driving controller outputting a voltage driving signal, the voltage driving controller outputting the voltage driving signal when the output circuit is first powered on, based on the external signal; and an output unit outputting an output voltage in accordance with the voltage driving signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A through 4D show signal waveforms of control signals of the detailed circuit diagram of FIG. 3;

FIG. 5 is a detailed circuit diagram of the output buffer of FIG. 2 according to the present invention;

FIGS. 7A through 7F show signal waveforms of control signals of the detailed circuit diagram of FIG. 6.

DETAILED DESCRIPTION OF THE PREFERRED EMBODIMENTS

Reference will now be made in detail to the preferred embodiments of the present invention, examples of which are illustrated in the accompanying drawings.

Figure 1:
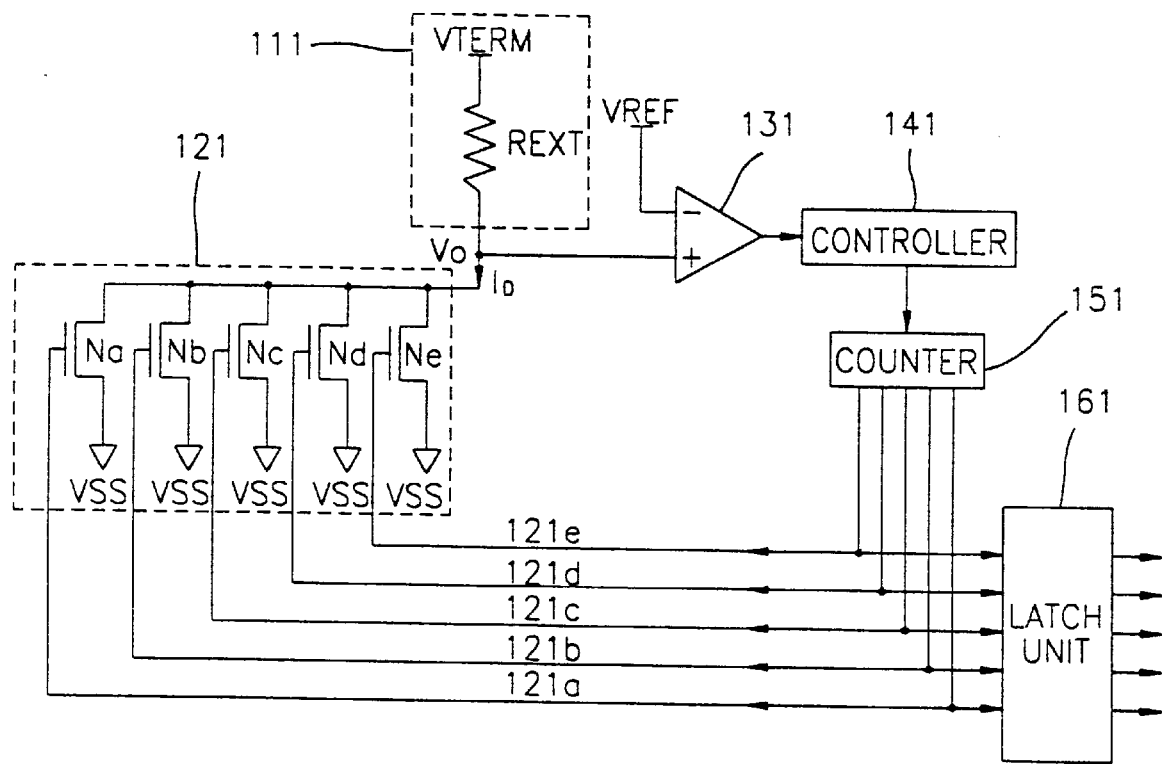
FIG. 1 is a schematic diagram of an output circuit diagram for a semiconductor device according to the conventional art.
Figure 2:
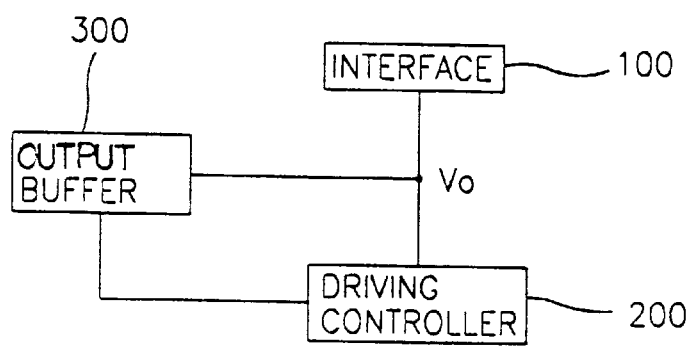
FIG. 2 is a block diagram of an output circuit for a semiconductor device according to the present invention.

Referring to FIG. 2, the output circuit according to the present invention includes an interface 100, driving controller 200, and an output buffer 300 outputting an output voltage Vo.

Figure 3:
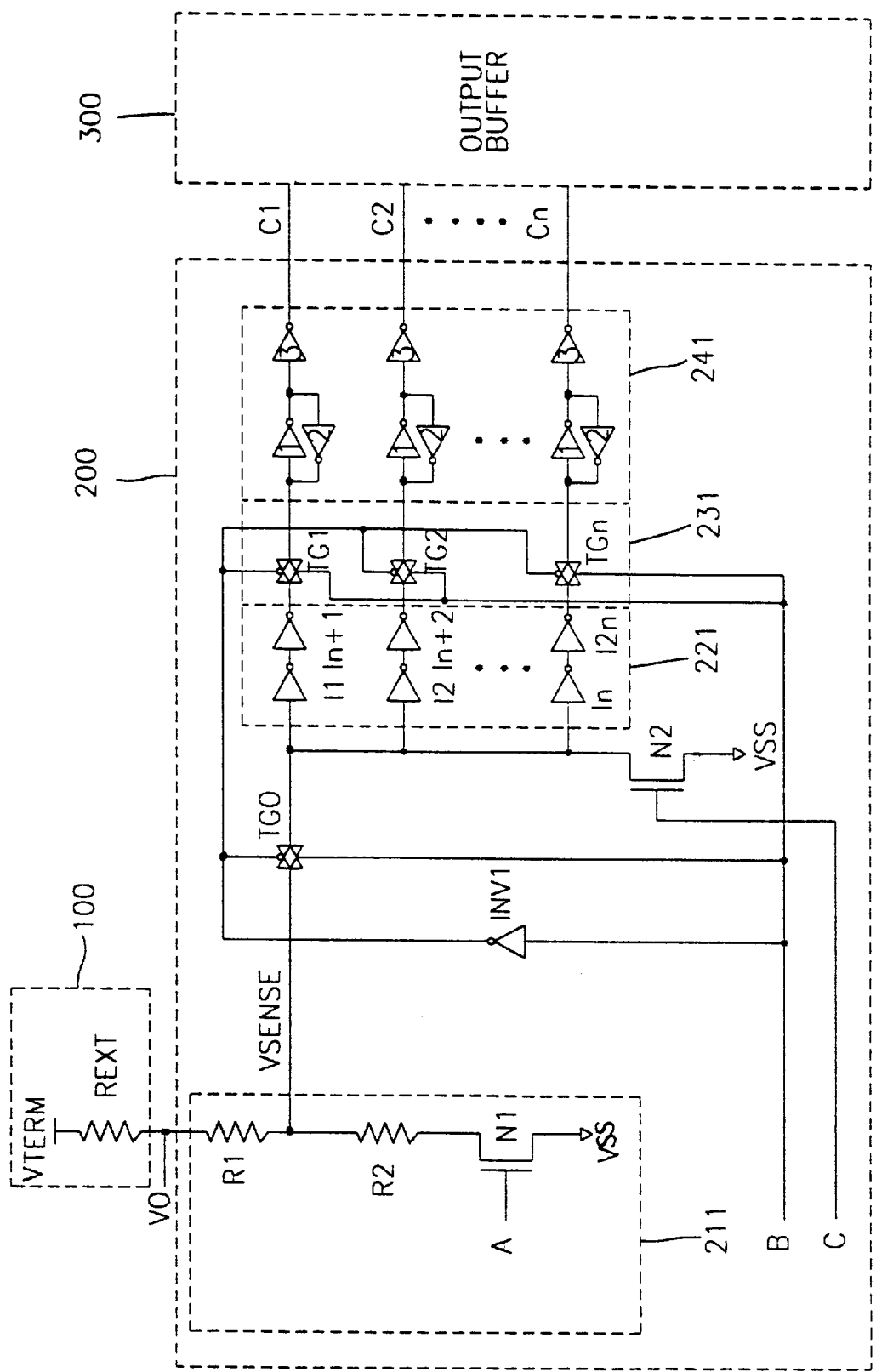
FIG. 3 is a detailed circuit diagram of the interface and the driving controller in FIG. 2 according to a first embodiment of the present invention.

Referring to FIG. 3, the output circuit having a driving controller 200 according to a first embodiment will now be explained.

As shown in FIG. 3, the interface 100 includes an external resister REXT with an external condition (i.e, a termination voltage VTERM) applied thereto. The driving controller 200 includes a condition sensor 211, a first inverter INV1, a first transmission gate TGO, a second NMOS transistor N2, a delay unit 221, a first transmitter 231, and a first latch unit 241.

The condition sensor 211 includes a first resistor R1, second resistor R2, and a first NMOS transistor N1 connected in series. The first resistor R1 is connected to the external resistor REXT of the interface 100, and the drain of the first NMOS transistor is connected to the second resistor R2. Also, the gate of the first NMOS transistor is connected to a first control line for receiving a first control signal A, and the source of the first NMOS transistor is connected to a ground voltage Vss.

The input of the first transmission gate TGO is connected to the common connection between the first and second resistors R1 and R2 for receiving a sensed voltage signal Vsense. The first transmission gate TGO includes a PMOS transistor and a NMOS transistor connected together. The gate of the NMOS transistor is connected to a second control line for receiving a second control signal B. In addition, the input of the first inverter INV1 is connected to the second control line to receive the second control signal B. The gate of the PMOS transistor is connected to the output of the first inverter INV1.

The gate of the second NMOS transistor N2 is connected to a third control line for receiving a third control signal C. The drain of the second NMOS transistor is connected to the output of the first transmission gate TGO, and the source of the second NMOS transistor N2 is connected to a ground voltage Vss.

The delay unit 221 includes a first through Nth row of first and second inverters 11, ln+1 through ln, 12n connected in series. The inputs of the first through Nth row of first inverters 11 through ln is connected to the output of the first transmission gate TG0 and the drain of the second NMOS transistor N2.

The first transmitter 231 includes first through Nth transmission gates TG1 through TGn. The inputs of the first through Nth transmission gates TG1 through TGn are connected to the outputs of the first through Nth row of second inverters ln+1 through 12n, respectively. In addition, each first through Nth transmission gate TG1 through TGn has a PMOS transistor and a NMOS transistor connected together. Each gate of the PMOS transistors is connected to the output of the first inverter INV1, and each gate of the NMOS transistors is connected to the second control line for receiving the second control signal B.

The first latch unit 241 includes first through Nth latches L1 to Ln. Each latch L1 through Ln includes a first inverter 1, second inverter 2, and a third inverter 3. The inputs of the first inverters 1 of the first through Nth latches L1 through Ln are connected to the output of the first through fifth transmission gates TG1 through TGn of the first transmitter 231, respectively. The inputs of the second inverters 2 are connected to the outputs of the first inverters 1, and the outputs of the second inverters 2 are connected to the inputs of the first inverters 1. The inputs of the third inverters 3 are connected to the outputs of the first inverters 1. Also, the outputs of the third inverters 3 output latched signals from the first transmitter 231 to the output buffer 300.

As shown in FIG. 5, the output buffer 300 includes a logic combination unit 311 and a voltage size adjustor 321.

The logic combination 311 includes a first set of AND gates ADa1 through ADan and a second set of AND gates ADb1 through ADbn. The first inputs of the first set of AND gates ADa1 through ADan are connected to the outputs of the third inverters 3 of the first through Nth latches L1 through Ln of the first latch unit 241, respectively. The second inputs of the first set of AND gates ADa1 through ADan are connected to a first data input line to receive a first data input DINa. The first inputs of the second set of AND gates ADb1 through ADbn are also connected to the outputs of the third inverters 3 of the first through Nth latches L1 through Ln of the first latch unit 241, respectively. The second inputs of the second set of AND gates ADb1 through ADbn are connected to a second data input line to receive a second data input DINb.

The voltage adjuster 321 includes a first set of NMOS transistors Na1 through Nan and a second set of NMOS transistors Nb1 through Nbn. Each of the second set of NMOS transistors Nb1 through Nbn is connected in series with a respective one of the first set of NMOS transistors Na1 through Nan. The drain of the first set of NMOS transistors Na1 through Nan is connected to a power source terminal Vcc, and the source of the second set of NMOS transistors Nb1 through Nb2 is connected to a ground voltage Vss. Also, the sources of the first set of NMOS transistors Na1 through Nan are connected to the drains of the second set of NMOS transistors Nb1 through Nbn, respectively. The gates of the first set of NMOS transistors Na1 through Nan are connected to respective outputs of the first set of AND gates ADa1 to ADan. Also, the gates of the second set of NMOS transistors Nb1 to Nbn are connected to respective outputs of the second set of AND gates ADb1 through ADbn. An output voltage signal Vo is transmitted from the common connection between the source and drain of the first set of NMOS transistors Na1 through Nan and the second set of NMOS transistors Nb1 through Nbn.

Referring to FIGS. 3, 4A–4D, and 5, the operation of the output circuit for a semiconductor device according to the first embodiment of the present invention will be described.

First, an initial output voltage Vo is determined by the termination voltage VTERM and the external resistor REXT of the interface 100. The initial output voltage Vo is sensed by the condition sensor 211 of the driving controller 200.

That is, a sensed voltage Vsense is determined by the resistances of the first resistor R1, second resistor R2, external resistor REXT, and the turn on resistance Ron of the first NMOS transistor N1. Because the external resistor REXT, first and second resistors R1 and R2, and the first NMOS transistor N1 are connected in series, the sensed voltage output from the common connection between the first resistor R1 and second resistor R2 is determined by the following equation (1).

$$V_{SENSE} = V_{TERM}\left(\frac{R_2 + R_{on}}{R_{EXT} + R_1 + R_2 + R_{on}(N_1)}\right) \quad (1)$$

As shown in FIGS. 4A and 4B, in a power up state (i.e., when the power goes high for the output circuit), the first control signal A simultaneously goes high, and is applied to the gate of the first NMOS transistor N1. Because the first control signal A goes high, the first NMOS transistor N1 turns "ON" which allows the condition sensor 211 to sense the initial output voltage Vo. Accordingly, a sensed voltage signal Vsense as determined by equation (1), appear at the common connection between the first and second resistors R1 and R2.

Then, the second control signal B goes high, as shown in FIG. 4C, and is applied to the input of the first inverter INV1 and to the gate of the NMOS transistor of the first transmission gate TG0. Also, the inverted second control signal B output from the first inverter INV1 is applied to the gate of the PMOS transistor of the first transmission gate TG0. As a result, the first transmission gate TG0 turns "ON". A transmission gate turns "ON" when a high logic level signal is applied to the gate of its NMOS transistor or a low logic level signal is applied to the gate of its PMOS transistor. Thus, because the first transmission gate TG0 is turned on, the sensed voltage signal Vsense is transferred to the delay unit 221 and the drain of the second NMOS transistor N2.

While the second control signal B is high, the third control signal C is low, as shown in FIG. 4D, and is applied to the gate of the second NMOS transistor N2. Since the third control signal C is low, the second NMOS transistor N2 is turned "OFF", thus, allowing the sensed voltage signal Vsense to pass through to the delay unit 221. Specifically, the sensed voltage signal Vsense is applied to the inputs of the first through Nth first inverters 11 through ln of the delay unit 221.

The sensed voltage signal Vsense is transmitted through the first through Nth first inverters 11 through ln as either a "1" or a "0" and delayed for a predetermined time. The first through Nth second inverters ln+1 through 12n invert and delay the output signals from the first through Nth first inverters 11 through ln, respectively. Then the inverted and delayed signals output from the first through Nth second inverters ln+1 through 12n are transmitted to the inputs of the first through Nth transmission gates TG1 through TGn of the first transmitter 231, respectively.

Because the second control signal B is still high, the second control signal B is applied to the gates of the NMOS transistors of the first through Nth transmission gates TG1 through TGn, and the inverted second control signal B from the output of the first inverter INV1 is applied to the gates of the PMOS transistors of the first through Nth transmission gates TG1 through TGn; thereby turning the first through Nth transmission gates TG1 through TGn "ON". Thus, the first through Nth transmission gates TG1 through TGn transfer the outputs of the second inverters ln+1 through l2n to the first through Nth Latches L1 through Ln of the first latch unit 241, respectively.

After the output signals from the first through Nth transmission gates TG1 through TGn are latched in each of the first through Nth latches L1 through Ln of the first latch unit 241, the second control signal B changes from high to low. As a result, the first through Nth transmission gates TG1 through TGn of the first transmitter 231 are turned "OFF." Also, as shown in FIG. 4D, the third control signal C changes from low to high, and the second NMOS transistor N2 turns "ON." While "ON" the second NMOS transistor N2 prevents the inputs of the first through Nth first inverters l1 through ln from floating.

Each trip voltage Vtp (i.e., voltage threshold at which an inverter inverts an input signal) for the first through Nth row of first and second inverters l1, ln+1 through ln, l2n differs and is set to a value between Vdd−|Vthp| and Vss+Vthn, where Vthp is a threshold voltage of PMOS, Vthn is a threshold voltage of NMOS, and Vdd is the power supply voltage for the driving controller 200. As a result, each pair of first and second inverters l1, ln+1 through ln, l2n establishes a different overall inversion threshold below which the output signal of the second inverter will be the inverse of the input signal received by the corresponding first inverter and equal to or above which the output signal of the second inverter will be the same as the input signal received by the corresponding first inverter. Thus, the output voltage driving level is determined in accordance with the outputs from the second row of inverters ln+1 through l2n.

Next the operation of the output buffer 300 will be described. The first latch unit 241 latches the outputs from the first through Nth transmission gates TG1 through TGn and outputs the first through Nth voltage driving level signals C1 through Cn. The first through Nth voltage driving level signals C1 through Cn and predetermined data signals DIN*a* and DIN*b* are applied to the logic combination unit 311 of the output buffer 300.

Specifically, the first inputs of the first set of AND gates AD*a*1 through AD*a*n receive the first through Nth voltage driving signals C1 through Cn, respectively, and the second inputs of the first set, of AND gates Adb1 through AD*a*n receive the predetermined first data signal DIN*a*. The first inputs of the second set of AND gates AD*ba* through AD*bn* receive the first through Nth voltage level signals C1 through Cn, respectively, and the second inputs of the second set of AND gates AD*ba* through AD*bn* receive the predetermined second data signal DIN*b*. The first set of AND gates AD*a*1 through Ad*a*n and the second set of AND gates AD*b*1 through AD*bn* perform an AND logic operation. The result of the AND operations are applied to the voltage level adjustor 321.

The gates of the first set of NMOS transistors N*a*1 through N*a*n receive the AND results of the first set of AND gates AD*a*1 through AD*a*n, respectively. The gates of the second set of NMOS transistors N*b*1 through N*b*n receive the AND results of the second set of AND gates AD*b*1 through Adbn, respectively. Then, the first set of NMOS transistors N*a*1 through N*a*n and the second set of NMOS transistors N*b*1 through N*b*n of the voltage level adjustor 321 are turned "ON" or "OFF" in accordance with the ANDed results. Based on which NMOS transistors are turned "ON" or "OFF" the output voltage Vo is selectively adjusted. Specifically, the voltage driving level signals C1 through Cn determined by the driving controller 200 adjust the final output voltage Vo.

Figure 6:
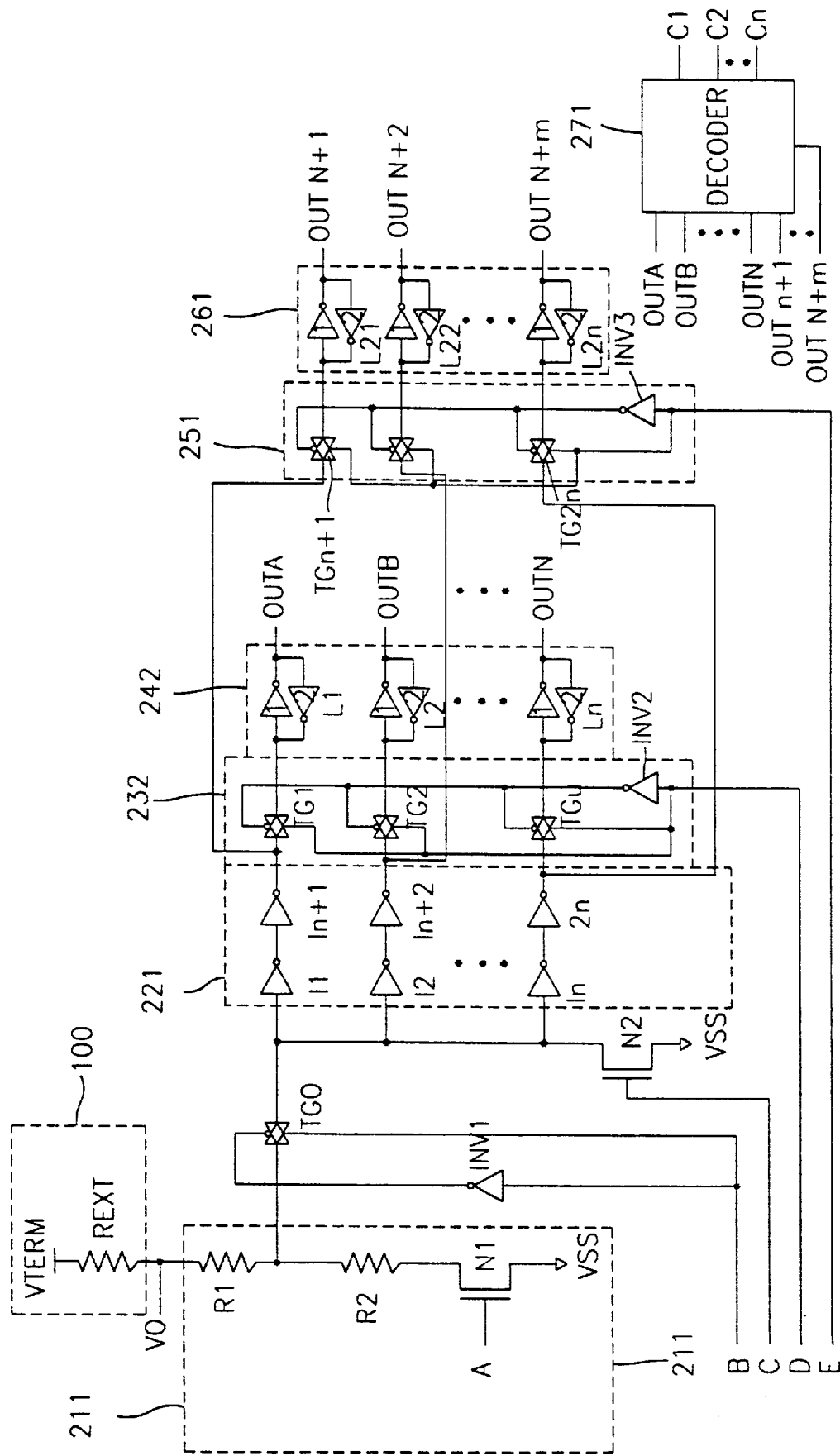
FIG. 6 is a detailed circuit diagram of another driving controller for the output circuit of a semiconductor device according to a second embodiment of the present invention.

FIG. 6 is a detailed output circuit diagram of another driving controller for the output circuit of a semiconductor device according to a second embodiment of the present invention wherein like reference numerals designate corresponding parts in FIG. 3.

As shown in FIG. 6, the driving controller includes a condition sensor 211, a first inverter INV1, a first transmission gate TG0, a second NMOS transistor N2, a delay unit 221, a first transmitter 232, a first latch unit 242, a second transmitter 251, a third inverter INV3, a second latch unit 261, and a decoder 271.

The interface 100, the condition sensor 211, the first inverter INV1, the first transmission safe TG0, the second NMOS transistor N2, and the delay unit 221 are connected in the same manner as in FIG. 3

The first transmitter 232 has a similar structure to the first transmitter 231 except that the first transmitter 232 includes a second inverter INV2 and selectively transmits based on a fourth control signal D. Specifically, the gates of the NMOS transistors of the first through Nth transmission gates TG1 through TGn is connected to a fourth control line for receiving the fourth control signal D. Also, the gates of the PMOS transistors of the first through Nth transmission gates TG1 through TGn are connected to the output of the second inverter INV2, and the input of the of the second inverter INV2 is connected to the fourth control line for receiving the fourth control signal D.

The first latch unit 242 is similar to the first latch unit 241 of FIG. 3, except that the third inverters 3 of the first through Nth latches L1 through Ln have been omitted. Thus, the outputs of the first inverters 1 of the first through Nth latches L1 through Ln output first through Nth latch signals OUT A through OUT N, respectively.

The second transmitter 251 includes first through Nth transmission gates TGn+1 through TG2n, and third inverter INV3. The gates of the NMOS transistors of the first through Nth transmission gates TGn+1 through TG2n and the third inverter INV3 receive a fourth control signal E via a fourth control line. Also, the output of the third inverter INV3 is connected to the PMOS transistors of the first through Nth transmission gates TGn+1 through TG2n of the second transmitter 251. The inputs of the first through Nth transmission gates TGn+1 through TG2n are connected to the outputs of first through Nth second inverters ln+1 through l2n, respectively.

The second latch unit 261 has the same structure as the first latch unit 242, but the inputs of the first through Nth latches L21 through L2n are connected to the outputs of the first through Nth transmission gates TGn+1 through TG2n of the second transmitter 251. The first through Nth latches L21 through L2n output first through Nth latch signals OUT N+1 through OUT N+m, respectively.

The decoder 271 has inputs for receiving the first through fifth latch signals OUT A through OUT N of the first latch unit 232 and the first through fifth latch signals OUT N+1 through OUT N+m of the second latch unit 261. The decoder 271 outputs the first through fifth output voltage driving level signals C1 through Cn.

Referring to FIGS. 7A through 7B and FIG. 6, the operation of the driving controller according to the second embodiment will be described.

FIG. 6 shows a second embodiment for adjusting the output voltage Vo based on the termination voltage VTERM for the interface 100. Thus, the method for determining the output voltage Vo must adjust according to any changes to the termination voltage VTERM.

In determining the output voltage Vo, the output voltage driving level must be determined. The output voltage driving level is determined by the first through Nth outputs OUT A through OUT N of the first latch unit 242 and the first through Nth outputs OUT n+1 through OUT N+m of the second latch unit 261.

To derive the output voltage driving level, a sensed voltage signal Vsense, based on the termination voltage VTERM, must first be determined. The sensed voltage signal Vsense is determined by the resistance values of the external resistor REXT, first and second resistors R1, the turn on resistance Ron for the first NMOS transistor N1, and the termination voltage VTERM using equation (1). Before the sensed voltage signal Vsense can be determined, the first NMOS transistor N1 must be turned on in accordance with a first control signal A having a high value, as shown in FIG. 7B. The first control signal A goes high simultaneously with the power up state of the output circuit as shown in FIG. 7A. Thus, when the first control signal A goes high, the first NMOS transistor N1 turns on and the sensed voltage signal Vsense is then determined by equation (1). Then, as the second control signal B goes high (See FIG. 7B), the first transmission gate TG0 turns on and transfers the sensed voltage signal Vsense to the inputs of the first through Nth first inverters 11 through in of the delay unit 221 and the drain of the second NMOS transistor N2. While second control signal B is high, the third control signal C is low, as shown in FIGS. 7B and 7C. When the third control signal C is low, the second NMOS transistor is off. As a result, the sensed voltage signal Vsense is transferred to the delay unit 221.

Consequently, the outputs of the first through Nth second inverters ln+1 through 12n of the delay unit 221 output either a "1" or a "0" based on a comparison of the different trip voltages Vtp for each inverter of the delay unit 221 with a voltage level of the received sensed voltage signal Vsense. Specifically, the trip voltages of each inverter of the delay unit 221 determine whether the outputs of the first through Nth second inverters ln+1 through 12n output a "1" or a "0" to the inputs of the first through Nth transmission gates TG1 through TGn of the first transmitter 232 and the first through Nth transmission gates TGn+1 through TG2n of the second transmitter 251.

As shown in FIGS. 7B and 7E, when the second control signal B first goes high the fourth control signal D goes high. Thus, the first through Nth transmission gates TG1 through TGn of the first transmitter 232 turn on in the same manner as first transmitter 231 in FIG. 3. Then the outputs of the first through Nth transmission gates TG1 through TGn transfer either a "1" or a "0" from the outputs of the delay unit 221 to the inputs of the first latch unit 242. The first through Nth latches Li through Ln of the first latch unit 242 outputs first through Nth latched output signals OUT A through OUT N to the decoder 271.

Then, as shown in FIG. 7E, the fourth control signal D goes low, and the first through Nth transmission gates TG1 through TGn are turned off. As a result, the first through Nth transmission gates TG1 through TGn cannot transfer the output values from the delay unit 221 to the first latch unit 242. As shown in FIG. 7F, the fifth control signal E goes high and turns on the first through Nth transmission gates TGn+1 through TG2n of the second transmitter 251 after the fourth control signal D goes low. Thus, the outputs of the first through Nth transmission gates TGn+1 through TG2n transfer either a "1" or a "0" from the outputs of the delay unit 221 to the inputs of the second latch unit 251. The first through Nth latches L21 through L2n of the second latch unit 242 outputs first through Nth second latched output signals OUT N+1 through OUT N+m to the decoder 271.

After a "1" or a "0" is latched in the first and second latch units 242 and 251, the third control signal C goes high as shown in FIG. 7D. Accordingly, the second NMOS transistor N2 is turned on and prevents the delay unit 221 from floating. As shown in FIG. 7C, the second control signal B changes from high to low at this time as well, and the first transmission gate TG0 is turned off; thereby cutting of the transfer of the sensed voltage signal Vsense.

The decoder 271 then decodes the input first latched output values OUT A through OUT N and the input second latched output values OUT N+1 through OUT N+m. The decoder 271, after decoding the inputted values, outputs the determined first through Nth output voltage driving level signals C1 through Cn to the output buffer 300.

Then the output buffer 300 outputs the output voltage based on the first through Nth output voltage driving level signals C1 through Cn in the same manner as in FIG. 3.

Figure 8:
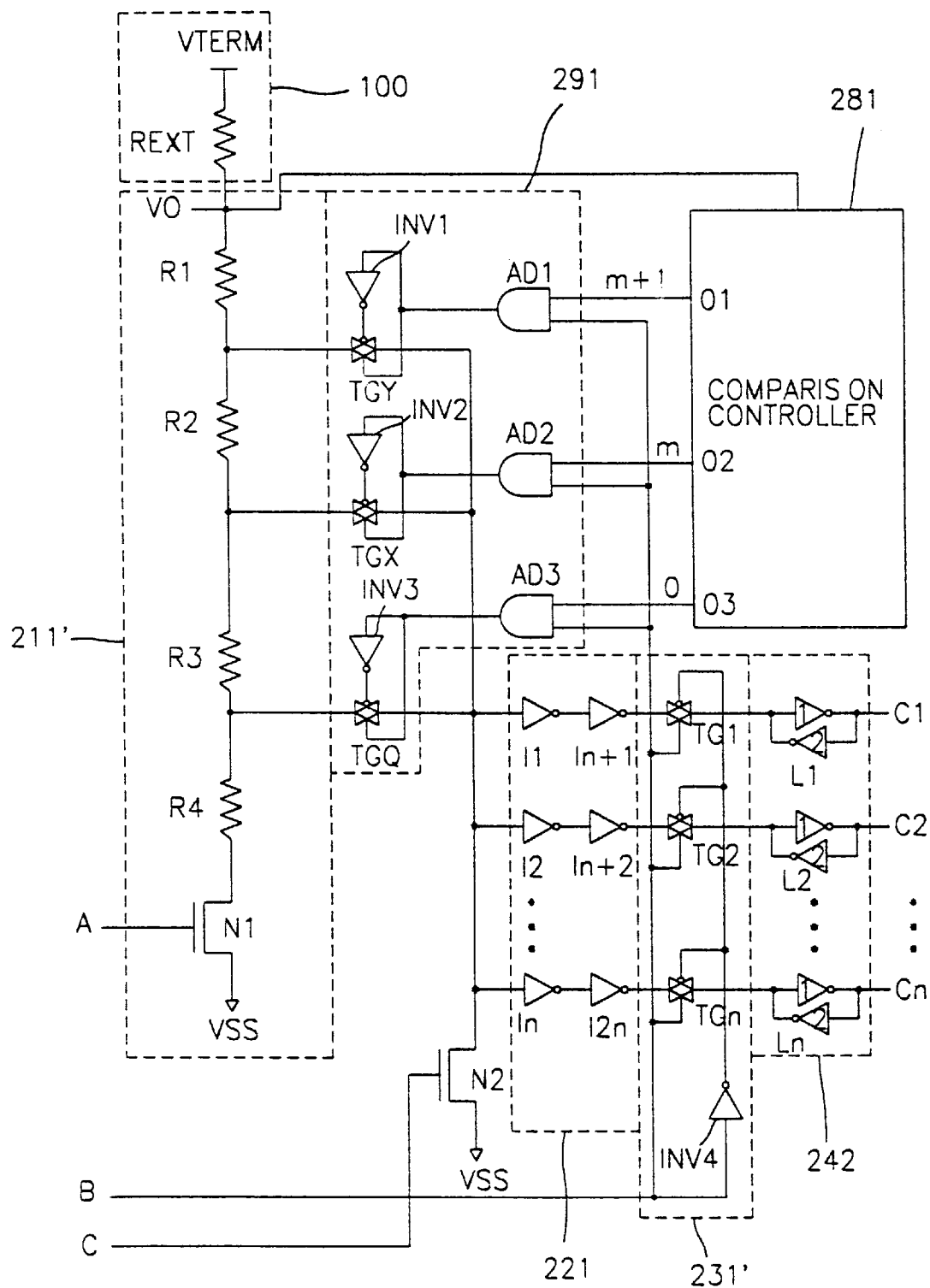
FIG. 8 is a detailed circuit diagram of another driving controller of the output circuit of a semiconductor device according to a third embodiment of the present invention.

FIG. 8 is a detailed circuit diagram of another driving controller of the output circuit of a semiconductor device according to a third embodiment of the present invention wherein like reference numerals designate corresponding parts as in FIG. 6.

Referring to FIG. 8, the driving controller includes a comparison controller 281, a condition sensor 211', an output voltage controller 291, a second NMOS transistor N2, a delay unit 221, a first transmitter 232, and a first latch unit 241.

The condition sensor 211' includes a first resistor R1, second resistor R3, third resistor R3, fourth resistor R4, and a first NMOS transistor connected in series. The first resistor R1 is connected to the external resistor REXT, and the drain of the first NMOS transistor N1 is connected to the fourth resistor R4. Also, the gate of the first NMOS transistor is connected to a first control line to receive a first control signal A, and a common connection between the first resistor R1 and the external resistor REXT is connected to an input of the comparison controller 281.

A first through third output terminal 01 through 03 of the comparison controller 281 output first through third comparison signals on first through third data lines m+1 through 0, respectively. The output voltage controller 291 includes first through third AND gates AD1 through AD3, first through third inverters INV1 through INV3, and first through third transmission gates TGY, TGX and TGQ. Each of the first through third transmission gates TGY through TGQ includes an NMOS and PMOS transistor connected together.

The first inputs of the first through third AND gates AD1 through AD3 are connected to the first through third data lines m+1 through 0, respectively. The second inputs of the first through third AND gates AD1 through AD3 are connected to a second control line to receive a second control signal B.

The inputs of the first through third inverters INV1 through INV3 are connected to the outputs of the first through third AND gates AD1 through AD3, respectively, and the outputs of the first through third inverters INV1 through INV3 are connected to the PMOS transistors of the first through third transmission gates TGY through TGQ. The gates of the NMOS transistors of the first through third transmission gates TGY, TGX and TGQ are connected to the outputs of the first through third AND gates AD1 through AD3, respectively. The input of the first transmission gate TGY is connected to a common connection between the first resistor R1 and the second resistor R2. The input of the second transmission gate TGX is connected to a common connection between the second resistor R2 and the third resistor R3, the input of the third transmission gate TGQ is connected to a common connection between the third resistor R3 and the fourth resistor R4.

The drain of the second NMOS transistor N2 is connected to the outputs of the first through third transmission gates TGY, TGX and TGQ and the inputs of the first through Nth row of first inverters I1 through in. The source of the second NMOS transistor Nz is connected to the predetermined reference voltage Vss, and the gate receives a third control signal C via a third control line.

The delay unit 221 is the same structure as in FIG. 6, except that the inputs of the first through Nth first inverters I1 through in are connected to the outputs of the first through third transmission gates TGY, TGX and TGQ.

The first transmitter 231' has the same structure as the first transmitter 232 in FIG. 6 except that the second inverter INV2 has been replaced with a fourth inverter INV4. The fourth inverter INV4 is connected to the second control line to receive the second control signal B. The first latch unit 242 has the same structure as in FIG. 6. Accordingly, the first through Nth latches L1 through Ln are connected to the outputs of the first through Nth transmission gates TG1 through TGn of the first transmitter 231', and the outputs of the first through Nth latches L1 through Ln output first through Nth voltage driving level signals C1 through Cn to the output buffer 300.

Referring to FIG. 8, the operation of the driving controller according to the third embodiment will be described.

Initially, the comparison controller 281 receives the output voltage Vo on the common connection between the first resistor R1 and the external resistor REXT. The initial output voltage Vo is determined only by the termination voltage VTERM and the external resistor REXT of the interface 100. Then the comparison controller 281 compares the voltage level of the initial output voltage Vo with a predetermined voltage level. If the comparison indicates that the voltage level of the initial output voltage Vo is less than the predetermined voltage level, the comparison controller 281 outputs the first through third comparison signals as 0 0 1 from the first through third output terminals 01 through 03 to the first through third data lines m+1 through 0, respectively.

As a result of the comparison controller 281 outputting 0 0 1 on the first through third data lines m+1 through 0, respectively, the first input of the third AND gate AD3 receives a "1" and the first inputs of the first and second AND gates AD1 and AD2 receive a "0". The second inputs of the first through third AND gates AD1 through AD3 receive the second control signal B. As described in FIG. 3 above, the second control signal B and the first control signal A go high simultaneously with power up signal, and the outputs of the first through third AND gates become 0, 0, 1, respectively. Thus, the third transmission gate TGQ is turned on because the gate of its PMOS transistor receives a low value from the output of the third inverter INV3 and its gate of the NMOS receives the "1" output from the third AND gate AD3. In addition, the first and second transmission gates TGY and TGX are turned off by the first and second AND gates AD1 and AD2 outputting a "0". Because the first control signal A is high, the first NMOS transistor N1 turns on. Also, since the third transmission gate TGQ is on, a voltage signal output from the common connection between the third resistor R3 and the fourth resistor R4 is selected and transferred through the third transmission gate TGQ as a sensed voltage signal Vsense to the drain of the second NMOS transistor N2 and the inputs of the first through Nth first inverters I1 through In of the delay unit 221. Because the third control signal C is low, the second NMOS transistor N2 is off because the gate of the second NMOS transistor N2 receives the third control signal C. Thus, the sensed voltage signal Vsense from the third transmission gate is transferred to the first through Nth first and second inverters I1, In+1 through In, I2n of the delay unit 221. Each of the inverters selectively outputs a "1" or a "0" based on their respective trip voltages Vtp as explained above with respect to the embodiment of FIG. 3.

Then first through Nth transmission gates TG1 through TGn of the first transmitter 231' transfer the outputs of the first through Nth outputs from the second inverters In+1 through I2n, respectively, in the same manner as the first transmitter 231 in FIG. 6. The first transmitter 231' of FIG. 8, however, selectively transfers based on the second control signal B. Then the first latch unit 241 receives the transferred signals from the first transmitter 231 and outputs the first through Nth voltage driving level signals C1 through Cn to the output buffer 300. The output buffer 300 outputs a new output voltage Vo that has a higher voltage level than the initial output voltage Vo.

When the output voltage Vo is still recognized by the comparison controller 281 to have a voltage level less than the predetermined voltage level, the first through third output terminals 01 through 03 of the comparison controller 281 output first through third comparison signals 1 1 0 on the first through third data lines m+1 through 0, respectively. The first through third AND gates AD1 through AD3 receive the first through third comparison signals 1 1 0, respectively. This is for the purpose of attaining a higher output voltage Vo. Thus, the first and second AND gates AD1 and AD2 receive a "1" on their first inputs and the high second control signal B on their second inputs.

Consequently, the outputs of the first and second AND gates AD1 and AD2 turn on the first and second transmission gates TGY and TGX, respectively. In same manner above, the voltage signals from the common connection between the first resistor R1 and the second resistor R2 and the common connection between the first resistor R2 and third resistor R3 is transferred through the first and second transmission gates TGY and TGX, respectively, as the sensed voltage signal Vsense. Then the sensed voltage signal is transferred through the delay unit 221, first transmission unit 231', and first latch unit 242 in the same manner discussed above. This is repeated until the voltage level of the output voltage Vo is larger than the predetermined voltage level.

When a set output voltage is obtained after repeating the above-described operation such that the set output voltage value is higher than the predetermined voltage level. The set output voltage is obtained from the first through Nth output voltage driving level signals C1 through Cn of the first latch unit 242. Thus, when latching is completed by the first latch unit 242, the second control signal B changes from a low level to a high level. As a result the second NMOS transistor N2 turns off and prevents the inverters of the delay unit 221 from floating.

As described in detail above, an output circuit for a semiconductor device can automatically control the variation of an output voltage driving level resulting from the change of an internal device and can be widely applied to a variety of interfaces. In addition, the operation time of the output circuit is shortened by the determination of the output voltage driving level simultaneously with power-up. The circuit construction is made simple which reduces the required area when embodying the circuit.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. An output circuit for a semiconductor device, comprising:
    an interface receiving an external signal;
    a voltage driving controller generating a voltage driving signal, the voltage driving controller including,
        a sensing unit sensing the external signal from the interface and outputting a sensed voltage signal based on the sensed external signal,
        a transmission gate transferring the sensed voltage signal from the sensing unit in accordance with a first control signal,
        a delay unit delaying the transferred sensed voltage signal from the transmission gate,
        a transmitting unit transmitting the delayed sensed voltage signal from the delay unit, and
        a latching unit latching the transmitted delayed sensed voltage signal and outputting the voltage driving signal; and
    an output unit outputting an output voltage in accordance with the voltage driving signal from the latching unit.

2. The output circuit of claim 1, wherein the external signal represents a termination voltage.

3. The output circuit of claim 1, wherein the sensing unit comprises:
    a first resistor, a second resistor, and a sensing NMOS transistor connected in series, the first resistor receiving the external signal, a drain of the sensing NMOS transistor connected to the second resistor, a source of the sensing NMOS transistor connected to a reference potential, and a gate of the sensing NMOS transistor receiving a second control signal.

4. The output circuit of claim 3, wherein an input of the transmission gate receives the sensed voltage signal form a common connection between the first resistor and the second resistor.

5. The output circuit of claim 4, wherein the transmission gate comprises:
    a PMOS transistor and a NMOS transistor connected together, a gate of the PMOS transistor receiving the first control signal and a gate of the NMOS transistor receiving an inverted first control signal.

6. The output circuit of claim 1, wherein the delay unit comprises:
    a plurality of rows of first and second inverters connected in series.

7. The output circuit of claim 6, wherein the voltage driving controller further includes:
    a floating NMOS transistor having a drain connected to an output of the transmission gate and to the input of the first inverter in each row of the plurality of rows of first and second inverters, a source connected to a reference potential, and a gate receiving a third control signal.

8. The output circuit of claim 6, wherein a trip voltage Vtp for each of the first and second inverters differs and satisfies $Vdd-|Vthp| \geq Vtp \geq Vss+Vthn$, where Vthp is a threshold voltage of PMOS, Vthn is a threshold voltae of NMOS, Vdd is a power supply voltage for the output circuit and Vss is a ground voltage.

9. The output circuit of claim 6, wherein the transmitting unit includes:
    a plurality of transmission gates, each transmission gate having an input connected to a corresponding output of one of the second inverters, each transmission gate including a PMOS transistor and a NMOS transistor connected together, a gate of each NMOS transistor receiving the first control signal and a gate of each PMOS transistor receiving the inverted first control signal.

10. An output circuit for a semiconductor device, comprising:
    an interface receiving an external signal;
    a voltage driving controller generating a voltage driving signal, the voltage driving controller including,
        a sensing unit sensing the external signal from the interface and outputting a sensed voltage signal based on the sensed external signal,
        a transmission gate transferring the sensed voltage signal from the sensing unit in accordance with a first control signal,
        a delay unit delaying the transferred sensed voltage signal from the transmission gate,
        a first transmitting unit transmitting the delayed sensed voltage signal from the delay unit,
        a first latching unit latching the transmitted delayed sensed voltage signal from the first transmitting unit and outputting a first latched signal,
        a second transmitting unit transmitting the delayed sensed voltage signal from the delay unit;
        a second latching unit latching the transmitted sensed voltage signal from the second transmitting unit and outputting a second latched signal, and
        a decoder receiving the first latched signal from the first latching unit and the second latched signal from the second latching unit and outputting the voltage driving signal; and
    an output unit outputting an output voltage in accordance with the voltage driving signal from the decoder.

11. The output circuit of claim 10, wherein the delay unit comprises:
    a plurality of rows of first and second inverters connected in series.

12. The output circuit of claim 11, wherein the voltage driving controller further includes:
    a floating NMOS transistor having a drain connected to the output of the transmission gate and to the input of the first inverter in each row of the plurality of rows of first and second inverters, a source connected to a reference potential, and a gate receiving a second control signal.

13. The output circuit of claim 11, wherein the first transmitting unit comprises:
    a plurality of transmission gates, each transmission gate having an input connected to a corresponding output of one of the second inverters, each transmission gate including a PMOS transistor and a NMOS transistor connected together, a gate of each NMOS transistor receiving a third control signal and a gate of each PMOS transistor receiving an inverted third control signal.

14. The output circuit of claim 11, wherein the second transmitting unit comprises:
    a plurality of transmission gates, each transmission gate having an input connected to a corresponding output of one of the second inverters, each transmission gate including a PMOS transistor and a NMOS transistor connected together, a gate of each NMOS transistor receiving a fourth control signal and a gate of each PMOS transistor receiving an inverted fourth control signal.

15. An output circuit for a semiconductor device, comprising:

an interface receiving an external signal;

a voltage driving controller generating a voltage driving signal, the voltage driving controller including,
 a comparison controller comparing an initial output voltage with a predetermined voltage and outputting a first control signal based on the comparison result,
 a sensing unit having multiple outputs, each output for outputting a voltage signal having a specific voltage level based on the external signal from the interface,
 an output voltage controller selectively receiving the voltage signals from the multiple outputs of the sensing unit in accordance with the first control signal and outputting the received voltage signals as a sensed voltage signal,
 a delay unit delaying the sensed voltage signal from the output voltage controller,
 a transmitting unit transmitting the delayed sensed voltage signal from the delay unit, and
 a latching unit latching the transmitted sensed voltage signal from the transmitting unit and outputting the voltage driving signal; and an output unit outputting an output voltage in accordance with the voltage driving signal from the latching unit.

16. The output circuit of claim 15, wherein the external signal represents a termination voltage.

17. The output circuit of claim 15, wherein the sensing unit comprises:

a first resistor, a second resistor, a third resistor, and a fourth resistor, and a sensing NMOS transistor connected in series, the first resistor receiving the external signal, a drain of the sensing NMOS transistor connected to the fourth resistor, a source of the sensing NMOS transistor connected to a reference potential, and a gate of the sensing NMOS transistor receiving a second control signal.

18. The output circuit of claim 17, wherein the output voltage controller comprises:

a first transmission gate, a second transmission gate, and a third transmission gate selectively receiving and outputting voltage signals from a common connection between the first resistor and second resistor, the second resistor and third resistor, and the third resistor and fourth resistor, respectively, based on the first control signal.

19. The output circuit of claim 15, wherein the delay unit includes:

a plurality of rows of first and second inverters connected in series.

20. The output circuit of claim 19, wherein the voltage driving controller further includes:

a floating NMOS transistor having a drain connected an output of each of the first, second, and third transmission gates of the output voltage controller and to the input of the first inverter in each row of the plurality of rows of fist and second inverters, a source connected to a reference potential, and a gate receiving a third control signal.

21. The output circuit of claim 19, wherein a trip voltage Vtp for each of the first and second inverters differs and satisfies Vdd−|Vthp |≧Vtp≧Vss+Vthn, where Vthp is a threshold voltage of PMOS, Vthn is a threshold voltage of NMOS, Vdd is a power supply voltage for the output circuit and Vss is a ground voltage.

22. The output circuit of claim 15, wherein the transmitting unit comprises:

a plurality of transmission gates, each transmission gate having an input connected to a corresponding output of one of the second inverters, each transmission gate including a PMOS transistor and a NMOS transistor connected together, a gate of each NMOS transistor receiving a fourth control signal and a gate of each PMOS transistor receiving an inverted fourth control signal.

23. An output circuit for a semiconductor device, comprising:

an interface receiving an external signal;

a delaying unit including a plurality of delays delaying the external signal to generate a voltage driving signal, each delay including a first inverter and a second inverter connected in series, a trip voltage Vtp for each of the first and second inverters differing and satisfying Vdd−|Vthp |≧Vtp ≧Vss+Vthn where Vthp is a threshold voltage of PMOS, Vthn is a threshold voltage of NMOS, Vdd is a power supply voltage for the output circuit and Vss is a ground voltage; and an output unit outputting an output voltage in accordance with the voltage driving signal.

24. An output circuit for a semiconductor device, comprising:

an interface receiving an external signal;

a voltage driving controller generating a voltage driving signal, the voltage driving controller including,
 a sensing unit sensing the external signal from the interface and outputting a sensed voltage signal based on the sensed external signal,
 a delay unit delaying the sensed voltage signal, the delay unit including a plurality of delays, each delay including first and second inverters connected in series and a trip voltage Vtp for each of the first and second inverters differing and satisfying Vdd−|Vthp |≧Vtp≧Vss+Vthn, where Vthp is a threshold voltage of PMOS, Vthn is a threshold voltage of NMOS, Vdd is a power supply voltage for the output circuit and Vss is a ground voltage,
 a transmitting unit transmitting the delayed sensed voltage signal from the delay unit as the voltage driving signal; and an output unit outputting an output voltage in accordance with the voltage driving signal.

25. The output circuit of claim 24, wherein the transmitting unit transmits the delayed sensed voltage signal based on a control signal.

26. The output circuit of claim 24, wherein the transmitting unit comprises:

a plurality of transmission gates, each transmission gate having an input connected to a corresponding output of one of the delays, each transmission gate including a PMOS transistor and a NMOS transistor connected together, a gate of each NMOS transistor receiving a first control signal and a gate of each PMOS transistor receiving an inverted first control signal.

27. The output circuit of claim 24, wherein the voltage driving controller outputs the voltage driving signal when the output circuit is first powered on.

* * * * *